United States Patent
Lee et al.

(10) Patent No.: US 6,397,049 B1
(45) Date of Patent: May 28, 2002

(54) TWO-WAY RADIO WITH IMPROVED SQUELCH

(75) Inventors: Siew Yin Lee, Penang; Chow Loong Cheah, Perak, both of (MY)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/431,376

(22) Filed: Nov. 1, 1999

(51) Int. Cl.[7] ................................. H04B 1/10
(52) U.S. Cl. ................ 455/218; 455/212; 455/220
(58) Field of Search ................... 455/218, 219, 455/220, 221, 222, 205, 212, 213; 340/7.35; 327/44, 68

(56) References Cited

U.S. PATENT DOCUMENTS

| | | | |
|---|---|---|---|
| 3,633,112 A | * 1/1972 | Anderson | 381/107 |
| 3,651,407 A | * 3/1972 | Sarallo et al. | 455/702 |
| 3,894,285 A | * 7/1975 | Schaeperkoetter | 455/213 |
| 4,041,496 A | * 8/1977 | Norris | 342/418 |
| 4,359,780 A | * 11/1982 | Day | 455/222 |
| 4,419,765 A | * 12/1983 | Wycoff et al. | 340/7.35 |
| 4,484,354 A | 11/1984 | Bennett et al. | |
| 5,058,138 A | * 10/1991 | Figura et al. | 375/88 |
| 5,109,525 A | * 4/1992 | Nichols | 455/74 |
| 5,146,187 A | * 9/1992 | Vandegraaf | 331/17 |
| 5,303,408 A | * 4/1994 | Ghomeshi et al. | 455/222 |
| 5,303,409 A | 4/1994 | Ruelke et al. | |
| 5,412,346 A | * 5/1995 | Burger, Jr. et al. | 330/282 |
| 5,564,090 A | * 10/1996 | Beauchamp et al. | 455/220 |
| 5,598,430 A | * 1/1997 | Hachisuka et al. | 375/216 |
| 6,047,170 A | * 4/2000 | Paulsen et al. | 455/212 |
| 6,133,784 A | * 10/2000 | Gregoire | 327/559 |
| 6,259,904 B1 | * 7/2001 | Branner et al. | 455/212 |

* cited by examiner

*Primary Examiner*—Dwayne Bost
*Assistant Examiner*—Joy K. Contee
(74) *Attorney, Agent, or Firm*—Frank M. Scuth; Randi L. Dulaney

(57) ABSTRACT

A two-way radio (1) that has a radio frequency receiver (2) having a modulated radio frequency signal output and a variable bandwidth filter (3) with an input coupled to the modulated radio frequency signal output. The radio (1) also has demodulator circuitry (4), a speaker (6) and processing circuitry (5). In use when the radio (1) is operating in squelch mode, the processing circuitry (5) controls the variable bandwidth filter (3) to have a first bandwidth and when in unsquelch mode the processing circuitry (5) controls the variable bandwidth filter (3) to have a second bandwidth which has a smaller frequency range and the first bandwidth.

7 Claims, 1 Drawing Sheet

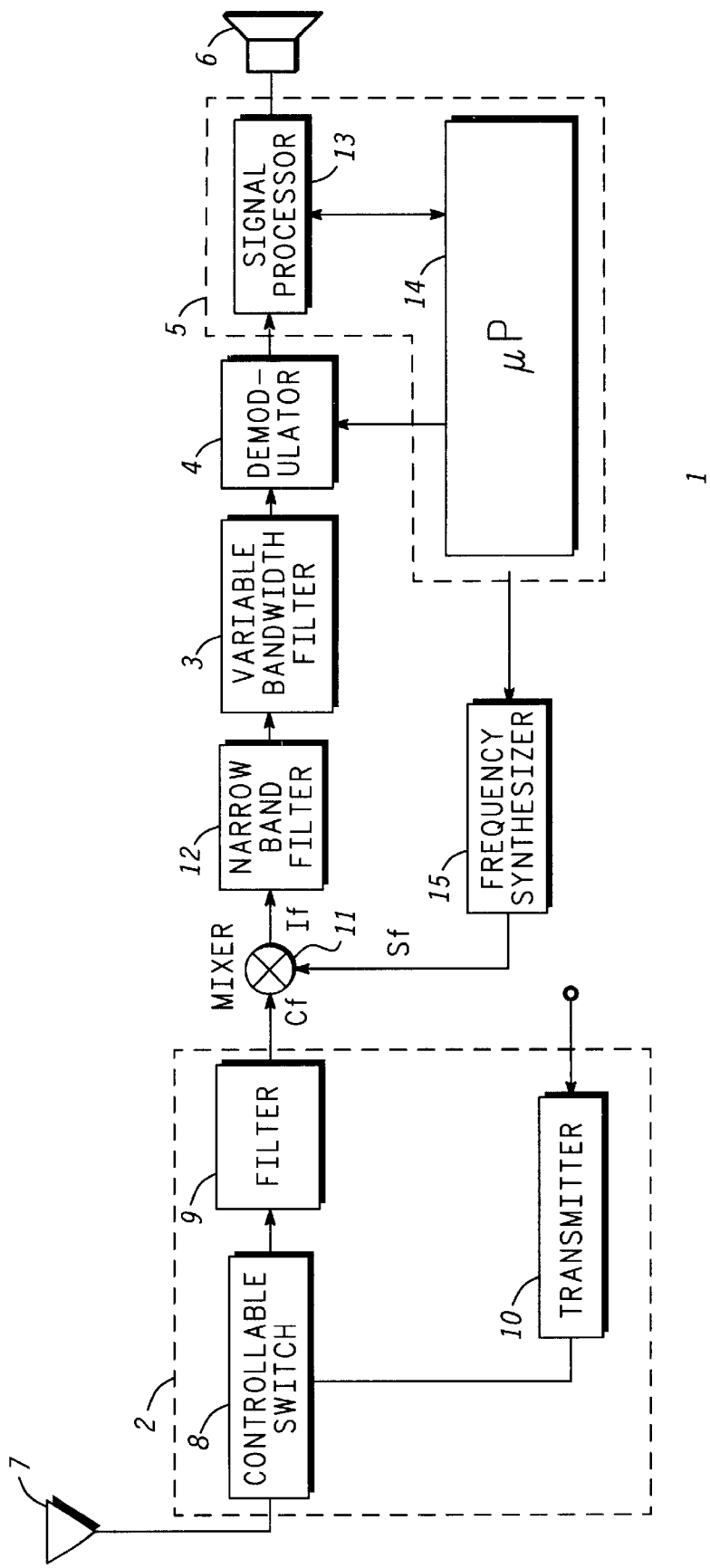
*FIGURE*

TWO-WAY RADIO WITH IMPROVED SQUELCH

FIELD OF THE INVENTION

This invention relates to two-way radios in general, and in particular to improving squelch in narrow band carrier frequency radios.

BACKGROUND ART

Two-way radios use what is known as squelch mode in which the radio speaker is silenced when there is no signal being received on an available radio frequency carrier. In large crowded cities available radio frequency communication channels, or carrier frequencies, will be affected by noise from both electrical equipment and cross channel interference. Accordingly, this noise may result in two-way radios that use squelch mode intermittently going to unsquelch mode. This can be annoying to users of such two-way radios and to overcome this problem wider squelch bandwidths are often used. Therefore unsquelching will only occur when a relatively strong carrier signal is present. However this solution is only satisfactory in urban areas where such relatively strong carrier signals are usually present.

Another problem associated with conventional squelch circuits is that undesirable clamping may result in which the two-way radio will intermittently go to squelch mode if high frequency voice signals fall within the squelch detector bandwidth.

SUMMARY OF THE INVENTION

It is an aim of this invention to overcome or alleviate at least one of the problems associated with two-way radios using squelch or at least provide the public with a useful alternative.

According to one aspect of the invention there is provided a two-way radio including:
 a radio frequency receiver having a modulated radio frequency signal output;
 a variable bandwidth filter having an input coupled to said modulated radio frequency signal output;
 demodulator circuitry coupled to said variable bandwidth filter;
 an audio transmitter; and
 processing circuitry having an input coupled to said demodulator circuitry and an output coupled to said audio transmitter, said processing circuitry having a control output coupled to a control input of said variable bandwidth filter, said processing circuitry providing for a squelch and unsquelch mode,
  wherein in use when said radio is operating in said squelch mode, said processing circuitry controls said variable bandwidth filter to have a first bandwidth and when said radio is operating in said unsquelch mode said processing circuitry controls said variable bandwidth filter to have a second bandwidth which has a smaller frequency range than said first bandwidth.

Preferably, said radio may be characterised by said first bandwidth having a frequency range which is at least 20% greater that of said second bandwidth.

Suitably, the second frequency range may be within the first frequency range.

Suitably, said processing circuitry may include a microprocessor and signal processor.

Preferably, said variable bandwidth filter and said demodulator circuitry may be in a single integrated circuit.

Suitably, said radio may also include:
 a frequency synthesizer controllable by said microprocessor; and
 a mixer having a first input coupled to said a modulated radio frequency signal output, and a second input coupled to an output of said frequency synthesizer, said mixer providing an output intermediate frequency to said variable bandwidth filter.

Suitably, said audio transmitter may be a speaker.

Preferably, said demodulator circuitry may be adapted for demodulating an amplitude modulated signal. In an alternative form, said demodulator circuitry may be adapted for demodulating a frequency modulated signal.

BRIEF DESCRIPTION OF THE DRAWING

In order that the invention may be readily understood and put into practical affect, reference will now be made to a preferred embodiment. The embodiment is illustrated in the FIGURE which is a schematic block diagram of part of a two-way radio in accordance with the present invention.

DETAILED DESCRIPTION OF THE PREFERRED EMBODIMENT OF THE INVENTION

Referring to the FIGURE there is illustrated part of a two-way radio 1 comprising a radio frequency transmitter and radio frequency receiver 2, a combined and coupled variable bandwidth filter 3 and demodulator circuitry 4 which are part of a Low voltage Zero Intermediate Frequency integrated circuit. The two-way radio 1 also includes processing circuitry 5 and a speaker 6.

The radio frequency receiver 2 comprises an antenna 7 coupled to a common node of a microprocessor controllable switch 8, another node of the switch 8 is coupled to an input of an amplifier and filter 9 and yet a further node of the switch 8 is coupled to transmitter circuitry 10 as will be apparent to a person skilled in the art. The output of the amplifier and filter 9 is a modulated radio frequency signal output which is coupled to an input of the variable bandwidth filter 3 by a mixer 11 and narrow band filter 12.

The processing circuitry 5 includes a signal processor 13 having an input coupled to an output of the demodulator circuitry 4. The signal processor 13 has an output coupled to drive the speaker 6. The processing circuitry 5 also includes a microprocessor 14 coupled to receive and supply handshake signals to the signal processor 13.

One output of the microprocessor 14 is coupled to a control input of the variable bandwidth filter 3 and another output is coupled to a control input of a frequency synthesizer 15 which has an output coupled to an input of the mixer 11.

In use, when the radio 1 is operating in transmit mode the microprocessor 14 controls the switch 8 so that the antenna 7 is coupled to the transmitter circuitry 10. This is effected by a user actuating a push to talk switch (not shown) as will be apparent to a person skilled in the art. However, when the radio 1 is operating in receive mode the microprocessor 14 controls the switch 8 so that the antenna 7 is coupled to the amplifier and filter 9. Accordingly, the modulated radio frequency output signal (Cf) from the radio frequency receiver 2 is supplied to an input of the mixer 11. A synthesized signal (Sf) is provided by the output of the frequency synthesizer 15 to the other input of the mixer 11, this signal is subtracted from the modulated radio frequency output signal Cf to provide an Intermediate frequency signal (IF) as will be apparent to a person skilled in the art. This Intermediate frequency signal IF is pre-processed by the narrow band filter 12 and then it is supplied to input of the variable bandwidth filter 3. After filtering by the variable bandwidth filter 3 the signal is demodulated by the demodulator circuitry 4. The demodulated signal is then processed by the signal processor 13 and if no carrier signal is detected then a squelch signal is sent to the microprocessor 14 and the signal processor 13 operates in squelch mode thereby muting speaker 6. As will be apparent to a person skilled in the art, the carrier signal is detected by sampling, filtering and rectifying the signal received by the processor 13 which then determines if the rectified signal is above a threshold level.

When in squelch mode the microprocessor 14 controls the variable bandwidth filter 3 to have a first bandwidth which in this embodiment is 8.28 Khz. However, if a valid carrier signal is detected by the signal processor 13 then an unsquelch signal is sent to the microprocessor 14 and the signal processor operates in unsquelch mode thereby unmuting the speaker 7. When in unsquelch mode the processor 14 controls the variable bandwidth filter 3 to have a second bandwidth which in this embodiment is 6.68 Khz. Hence, the frequency range of the first bandwidth is greater than the second bandwidth frequency range by more than 20%.

Advantageously, the present invention allows for a greater signal frequency range to be processed by the signal processor 13 when the radio is operating in squelch mode. This thereby allows for a higher threshold level to be used by the signal processor 13 when determining if the radio 1 should change from squelch to unsquelch mode. This advantageously reduces the possibility of the radio 1 intermittently changing to unsquelch mode. Further, when in unsquelch mode the frequency range of the variable bandwidth filter 3 is reduced which can alleviate or limit the possibility of undesirable clamping by high frequency voice signals.

Although the invention has been described with reference to a preferred embodiment it is to be understood that the invention is not restricted to the embodiment described herein.

We claim:

1. A two-way radio including:

a radio frequency receiver having a modulated radio frequency signal output;

a variable bandwidth filter having an input coupled to said modulated radio frequency signal output;

demodulator circuitry coupled to said variable bandwidth filter;

an audio transmitter; and processing circuitry having an input coupled to said demodulator circuitry and an output coupled to said audio transmitter, said processing circuitry having a control output coupled to a control input of said variable bandwidth filter, said processing circuitry providing for a squelch and unsquelch mode, wherein in use when said radio is operating in said squelch mode, said processing circuitry controls said variable bandwidth filter to have a first bandwidth and when said radio is operating in said unsquelch mode said processing circuitry controls said variable bandwidth filter to have a second bandwidth which has a smaller frequency range than said first bandwidth.

2. A two way radio as claimed in claim 1, wherein said first bandwidth has a frequency range which is at least 20% greater that of said second bandwidth.

3. A two way radio as claimed in claim 1, wherein the second frequency range is within the first frequency range.

4. A two way radio as claimed in claim 1, wherein said processing circuitry includes a microprocessor and signal processor.

5. A two way radio as claimed in claim 1, wherein said variable bandwidth filter and said demodulator circuitry are in a single integrated circuit.

6. A two way radio as claimed in claim 1, wherein said radio also includes:

a frequency synthesizer controllable by said microprocessor; and a mixer having a first input coupled to said a modulated radio frequency signal output, and a second input coupled to an output of said frequency synthesizer, said mixer providing an output intermediate frequency to said variable bandwidth filter.

7. A two way radio as claimed in claim 1, wherein, said audio transmitter is a speaker.

* * * * *